United States Patent [19]
Nestvall

[11] Patent Number: 5,947,188
[45] Date of Patent: Sep. 7, 1999

[54] METHOD AND A DEVICE FOR PERMITTING COOLING OF HEAT-SENSITIVE COMPONENTS

[75] Inventor: Per Nestvall, Göteborg, Sweden

[73] Assignee: AB Volvo Penta, Gothenburg, Sweden

[21] Appl. No.: 08/983,432

[22] PCT Filed: Jul. 5, 1996

[86] PCT No.: PCT/SE96/00916

§ 371 Date: Mar. 12, 1998

§ 102(e) Date: Mar. 12, 1998

[87] PCT Pub. No.: WO97/03543

PCT Pub. Date: Jan. 30, 1997

[30] Foreign Application Priority Data

Jul. 7, 1995 [SE] Sweden .................................. 9502498

[51] Int. Cl.$^6$ ................................ F28F 7/00; H05K 7/20
[52] U.S. Cl. .......................... 165/41; 165/80.4; 165/185; 123/41.31; 361/699; 361/707
[58] Field of Search .............................. 165/80.4, 41, 51, 165/185; 123/41.31, 198 E, 196 AB; 62/7; 361/689, 699, 707, 709, 710

[56] References Cited

U.S. PATENT DOCUMENTS

| | | | |
|---|---|---|---|
| 3,648,113 | 3/1972 | Rathjen et al. | 361/707 |
| 3,965,971 | 6/1976 | Roggenkamp | 165/41 X |
| 4,186,422 | 1/1980 | Laermer | 361/707 X |
| 4,364,355 | 12/1982 | Karino | 123/41.31 X |
| 4,532,893 | 8/1985 | Day et al. | 123/41.31 |
| 4,543,914 | 10/1985 | Harris | 123/41.43 |
| 4,763,611 | 8/1988 | Kobayashi et al. | 123/41.31 |
| 4,849,858 | 7/1989 | Grapes et al. | 361/707 X |
| 4,893,590 | 1/1990 | Kashimura et al. | 123/41.31 |
| 5,105,875 | 4/1992 | McArthur | 165/41 X |
| 5,351,664 | 10/1994 | Rotter et al. | 123/196 AB |
| 5,406,922 | 4/1995 | Tuckey | 123/41.31 X |
| 5,429,120 | 7/1995 | Burke et al. | |
| 5,482,109 | 1/1996 | Kunkel | 361/707 X |

Primary Examiner—Leonard Leo

[57] ABSTRACT

A device (10) for cooling heat-sensitive components is disclosed. The device includes a housing (12) for receiving the components, and attachment means integral with the housing for attaching the device (10) to another component (24). The attachment means is provided with at least one passage (30; 32) for through flow of a cooling medium. The attachment means has an attachment member (22) connected to the housing (12) via a heat-conducting flange (23), with the attachment member having means for providing the attachment member between two components (26, 28), which components, in the absence of the attachment member, are couplable to each other.

11 Claims, 3 Drawing Sheets

METHOD AND A DEVICE FOR PERMITTING COOLING OF HEAT-SENSITIVE COMPONENTS

This application is the national phase under 35 U.S.C. §371 of prior PCT International Application No. PCT/SE 96/00916 which has an International filing date of Jul. 5, 1996 which designated the United States of America, the entire contents of which are hereby incorporated by reference.

TECHNICAL FIELD

The present invention relates to a device for cooling heat-sensitive components, and to a method of cooling electronic components forming at least a part of an electronic management system for a combustion engine.

BACKGROUND OF THE INVENTION

In many forms of motorized transport and particularly in marine applications, the engine and the vehicle, to which the engine is to be fitted, are produced by different manufacturers. To simplify installation and to ensure a high degree of operational reliability, it is desirable if the engine can be delivered to the vehicle manufacturer as a complete unit, i.e. with as many ancillary components, such as water pumps, alternators and oil pumps, as possible included in the unit.

Due in part to increasingly stringent exhaust emission requirements, modern engines require an electronic engine management system to ensure optimal combustion of the fuel. Because of the heat-sensitive nature of the electronic components included in the engine management system, these components have traditionally been housed in a box mounted at a location remote from the engine, for example on a bulkhead. Although such an arrangement implies that the electronic components are not exposed to excessively high temperatures, it does mean that a considerable length of cabling is required between the engine and the box, thereby exposing the engine management system to possible electrical interference. Furthermore, due to the fact that the engines may be used in different applications, the length of cabling required will depend on the type of vehicle to which the engines are to be fitted. In addition, a separate mounting arrangement for the box is needed for each application.

A fuel pumping apparatus is disclosed in U.S. Pat. No. 4,543,914 for supplying fuel to an internal combustion engine. The apparatus includes a pump having a body and a solenoid operated fuel control device. The current flow to the solenoid is controlled by a control circuit located within an inner casing secured to the body of the pump. An outer casing surrounds the inner casing and defines a space which is connected with a fuel inlet, the space communicating with a fuel inlet of the pump. The flow of fuel through the space assists the cooling of the components of the control circuit.

Although the above-described arrangement allows the components of the control circuit to be located in close proximity of the pumping apparatus, the pump has to be particularly adapted to receive the inner and outer housings. In other words, existing traditional fuel pumping apparatus must be modified to be able to accommodate the control circuit components. Furthermore, since the apparatus of U.S. Pat. No. 4,543,914 requires the use of an inner and an outer casing attached to the pump, the apparatus is relatively bulky, something which may rule out the possibility of using the apparatus in confined spaces.

SUMMARY OF THE INVENTION

It is therefore an object of the present invention to provide a device for cooling heat-sensitive components which overcomes the above-mentioned drawbacks.

More particularly, it is an object of the present invention to provide a device for cooling heat-sensitive components, which device can be attached to existing components of e.g. an engine without having to modify the existing components and which device can be used in applications in which space is at a premium.

This object is achieved by a device for cooling heat-sensitive components, said device comprising a housing for receiving said components and attachment means integral with said housing for attaching said device to a further component, said attachment means being provided with at least one passage for through flow of a cooling medium, wherein said attachment means includes an attachment member connected to the housing via a heat-conducting flange, said attachment member having means for permitting the attachment member to be located between two components, which components, in the absence of the attachment member, are couplable to each other.

It is a further object of the present invention to provide a method of cooling electronic components forming at least a part of an electronic management system for a combustion engine.

This object is achieved by a method of cooling electronic components forming at least a part of an electronic management system for a combustion engine, said components being mounted in a housing of a device, said device further comprising an attachment member, said method comprising placing said attachment member between two components making up a fuel filter assembly and passing fuel for said engine through a passage in said attachment member.

Due to the fact that the attachment member of the device, according to the present invention, is connected to the housing of the device via a heat-conducting flange, the housing may be positioned at a location where sufficient space is available. Furthermore, since the attachment member is adapted to be placed between two components which otherwise are directly coupled together, the device according to the invention can be easily attached to existing components of e.g. an engine.

BRIEF DESCRIPTION OF THE DRAWINGS

The invention will be described in the following in greater detail by way of example only and with reference to the attached drawings, in which.

DETAILED DESCRIPTION OF PREFERRED EMBODIMENTS

Figure 1:
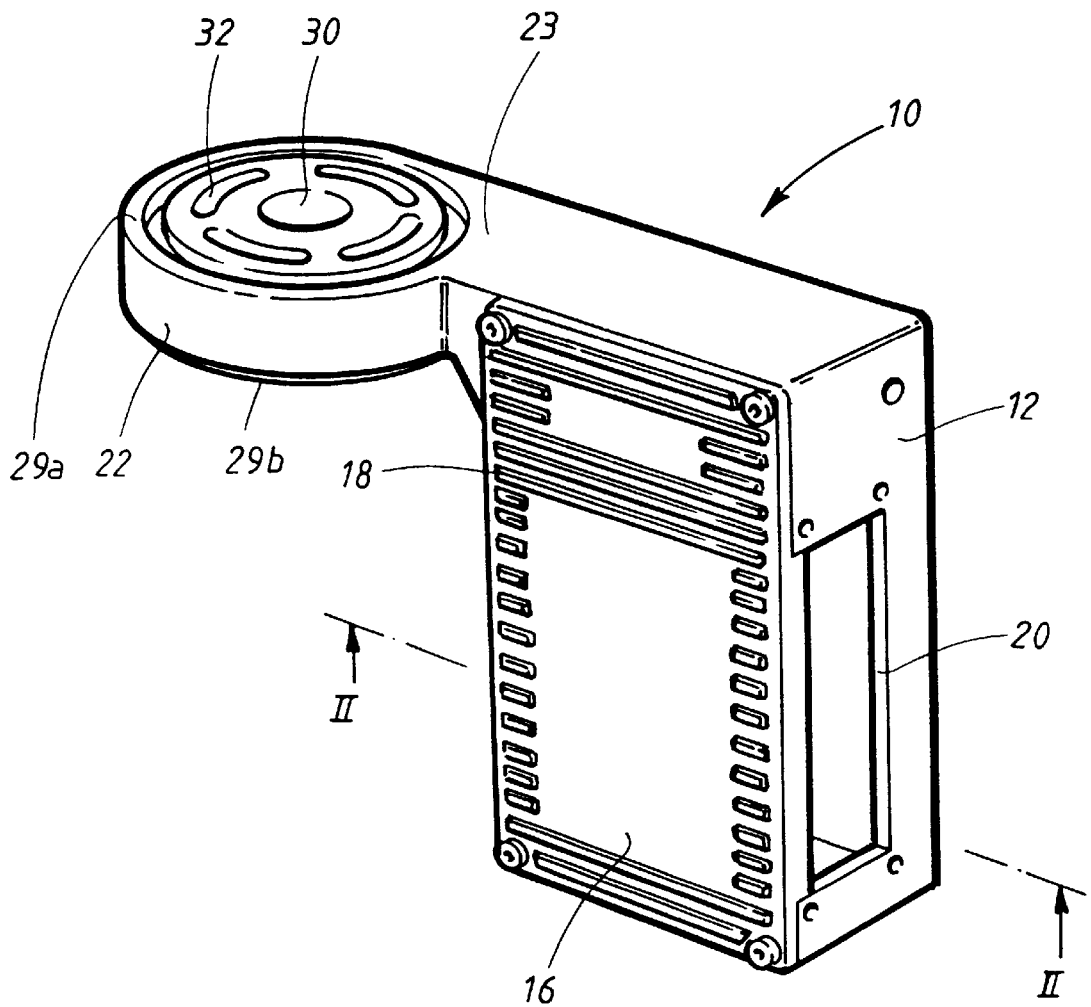
FIG. 1 is a schematic perspective view of the device according a preferred embodiment of the present invention.

In the drawings, reference numeral 10 generally denotes a device for cooling heat-sensitive components according to a preferred embodiment of the present invention. The device 10 comprises a housing 12, which delimits a compartment 14 (FIG. 2) intended to receive not-shown heat sensitive components. Access to the compartment may be gained via a removable cover 16. To aid the cooling of the heat-sensitive components, the cover 16 may be provided with one or more cooling fins 18.

In the following, the device according to the embodiment will be described when employed for the cooling of electronic components included in an electronic engine management system for a marine diesel engine, though it is to be understood that other fields of application of the device are conceivable.

Accordingly, the housing 12 is further provided with an opening 20 within which a not shown connector block may be accommodated, which connector block allows the electronic components within the housing to be connected to external cabling. The electronic components within the housing are advantageously moulded in a plastic matrix to reduce their susceptibility to vibration.

The device 10 of the embodiment further comprises an attachment member 22 integrally formed with, and connected to, the housing 12 via a flange 23 extending from the housing 12. Advantageously, the attachment member, the housing and the flange are made from the same material. The invention is not limited to any particular material, though a material with a high coefficient of thermal conductivity is preferred. A typical material may be aluminium. Although the flange 23 is shown in the drawings as extending perpendicularly from a wall of the housing, it will be understood that the flange may extend it any angle and may be of any length, the actual angle and length being determined by factors such as space constraints. Naturally, in order to obtain optimum cooling of the components within the housing 12, the flange 23 should preferably be as short as possible.

Figure 3:
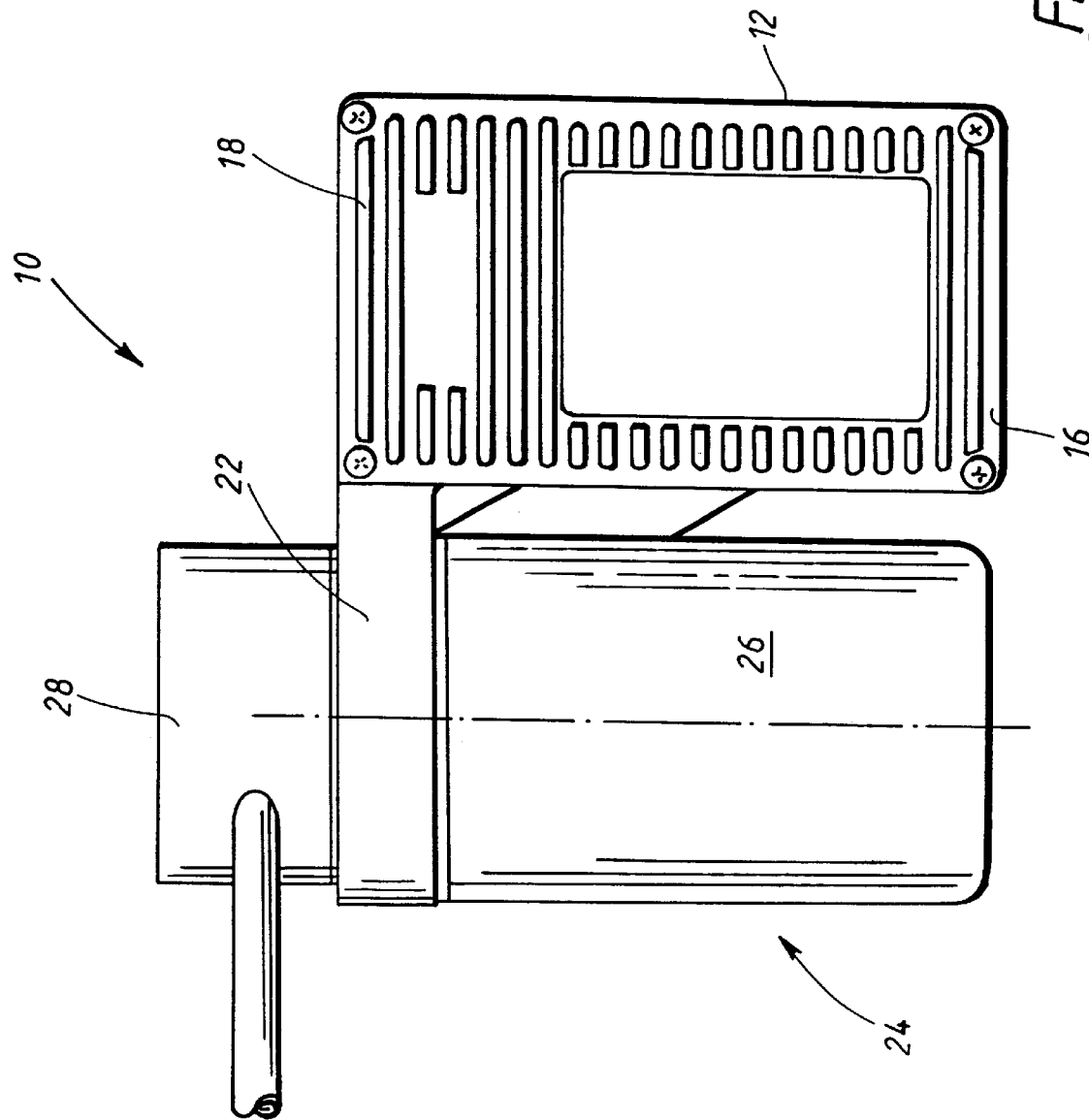
FIG. 3 is a schematic elevational view of the device according to the embodiment of the present invention affixed to a fuel filter assembly.

As is most clearly shown in FIG. 3, the attachment member 22 serves to permit the device to be attached to a further component, in this case to a fuel filter assembly 24. The fuel filter assembly comprises a fuel filter 26 and a fuel inlet/outlet head 28. The head 28 is provided with a not shown bracket to allow the fuel filter assembly to be attached to the engine. In order to provide the attachment member between the head 28 and the fuel filter 26 without the need to modify either component, the attachment member is provided with opposed major surfaces 29a, 29b resp. having means in the form of grooves, recesses, screw-threads or the like to locate respective components.

In the embodiment illustrated in FIG. 3, the attachment member 22 of the device 10 is adapted to be firmly bolted to the inlet/outlet head 28 by means of a not shown internal hollow bolt. This bolt also serves to permit the fuel filter 26 to be removably screwed to the major surface 29b of the abutment member 22, i.e. that surface remote from the fuel inlet/outlet head 28.

By utilizing an existing engine component, which is already attached to the engine, no separate bracket is needed for the mounting of the device to the engine.

In accordance with the embodiment of the present invention, the attachment member 22 is provided with at least one passage 30 for the through flow of a cooling medium. In the preferred embodiment shown in the drawings, the cooling medium is thus the fuel which is to be filtered by the filter 26, though it is to be understood that other cooling mediums such as oil or water may be employed depending on the field of application of the device.

Figure 2:
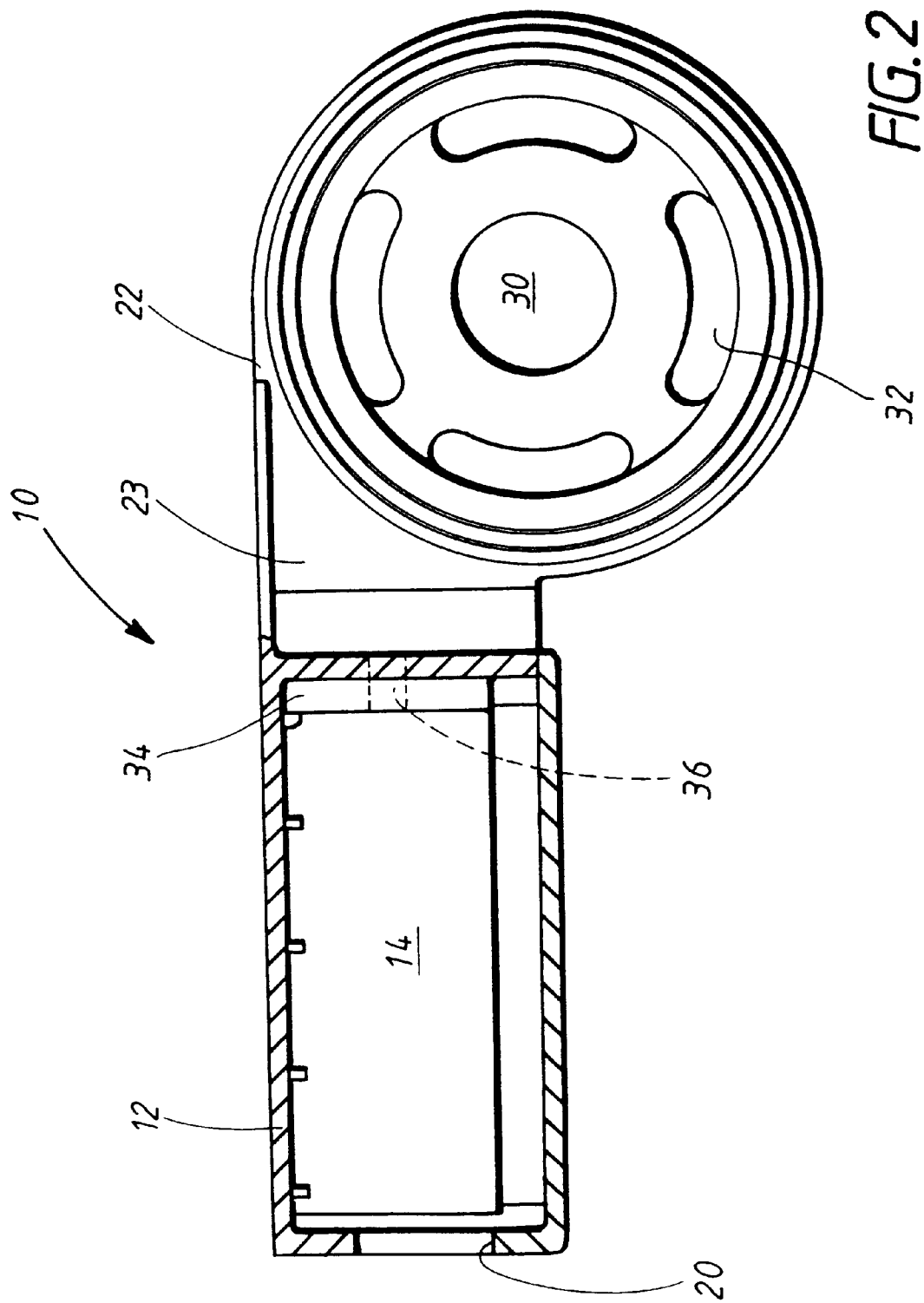
FIG. 2 is a sectional view along line II—II of FIG. 1.

As is most clearly shown in FIGS. 1 and 2, in addition to the passage 30, the flange 22 is provided with a plurality of through flow passages 32 radially distributed about the passage 30. The passages 30 and 32 permit the fuel to be fed to and removed from the filter 26. In addition, the central passage 30 is dimensioned to receive the above-mentioned internal hollow bolt used to secure the device 10 to the fuel filter assembly 24.

In order to ensure a good thermal path between the attachment member 22 and the components housed in the housing 12, and as shown in FIG. 2, it is beneficial if the flange 23 extends from a region 34 of a wall of the housing, which is made of material of greater thickness than remaining portions of the housing. The region 34 of greater thickness may extend around several of the walls of the housing. Since such a region acts as a heat sink, it is advantageous if particularly heat-sensitive components are mounted adjacent this region.

The device may further comprise a temperature sensor 36 as indicated by dashed lines in FIG. 2 arranged in the vicinity of the attachment member 22. This sensor can be used to measure the temperature of fuel flowing through the attachment member and to relay this information to the engine management system.

The invention is not restricted to the embodiments described above and shown in the drawing but may be varied within the scope of the appended claims. For example, the heat-sensitive components need not be accommodated within a closable compartment, but may instead be attached directly to an exposed wall. Important for the realisation of the invention is only that such a wall cooperates with an attachment member having a through flow passage for a cooling medium.

What is claimed is:

1. A device for cooling heat-sensitive components, comprising:
   a housing for storing the heat-sensitive components therein;
   an attachment member having a first attaching portion for attaching a first component, different from said heat-sensitive components, and a second attaching portion for attaching a second component, different from said heat-sensitive components, said attachment member having at least one passage connecting said first and second attaching portions for passing a cooling medium, that cools said attachment member, between the first and second components; and
   a heat-conducting flange connecting said housing and said attachment member such that said housing is cooled by said attachment member through said heat-conducting flange.

2. The device as claimed in claim 1, wherein said first and second components form a fuel filter assembly sand said cooling medium is a fuel.

3. The device as claimed in claim 2, further comprising:
   a temperature sensor arranged in the vicinity of said attachment member for measuring the temperature of cooling medium flowing therethrough.

4. The device as claimed in claim 1, wherein said heat-sensitive components are electronic components.

5. The device as claimed in claim 1, wherein said flange extends from a region of a wall of said housing, said region being made of material of greater thickness than remaining portions of said housing.

6. A device according to claim 1, wherein said first and second components are directly connectable to each other in the absence of said attachment member.

7. A method of cooling electronic components of an electronic management system for a combustion engine, comprising:
   providing the electronic components in a housing;
   providing an attachment member integrally connected to said housing;
   placing said attachment member between two components that form a fuel filter assembly; and
   passing fuel for said engine, as a cooling medium, between the two components through a passage in said attachment member to cool said attachment member, such that said housing is cooled by said cooled attachment member.

8. A device for cooling heat-sensitive components, comprising:

a housing including a compartment portion having an opening for storing the heat-sensitive components therein, and a removable cover for covering the opening to form a closed compartment;

an attachment member having a first attaching portion for attaching a first component and a second attaching portion for attaching a second component, said attachment member having at least one passage connecting said first and second attaching portions for passing a cooling medium, that cools said attachment member, between the first and second components; and a heat-conducting flange connecting said housing and said attachment member such that said housing is cooled by said attachment member through said heat-conducting flange.

9. A device of claim 8, wherein said heat-sensitive components are electronic components.

10. A device of claim 9, wherein said housing includes an opening for passing, therethrough, cables connected to the electronic components.

11. A device of claim 8, wherein said housing includes cooling fins to enhance cooling of said housing.

\* \* \* \* \*